United States Patent
Bazarjani

[19]

[11] Patent Number: 6,137,321
[45] Date of Patent: Oct. 24, 2000

[54] LINEAR SAMPLING SWITCH

[75] Inventor: Seyfollah S. Bazarjani, San Diego, Calif.

[73] Assignee: Qualcomm Incorporated, San Diego, Calif.

[21] Appl. No.: 09/228,826

[22] Filed: Jan. 12, 1999

[51] Int. Cl.[7] .................................................. G11C 27/02
[52] U.S. Cl. ............................................................. 327/96
[58] Field of Search ............................. 327/91, 94, 95, 327/96, 337, 554; 341/122–124

[56] References Cited

U.S. PATENT DOCUMENTS

| | | | |
|---|---|---|---|
| 4,988,900 | 1/1991 | Fensch | 307/494 |
| 5,532,624 | 7/1996 | Khoury | 327/95 |
| 5,689,201 | 11/1997 | Temes et al. | 327/95 |
| 5,724,000 | 3/1998 | Quinn | 327/554 |
| 5,736,895 | 4/1998 | Yu et al. | 327/554 |
| 5,894,284 | 4/1999 | Garrity et al. | 341/172 |
| 5,905,397 | 5/1999 | Koifman et al. | 327/337 |
| 5,963,156 | 10/1999 | Lewicki et al. | 341/122 |
| 5,973,536 | 10/1999 | Maejima | 327/337 |
| 6,031,399 | 2/2000 | Vu et al. | 327/96 |

OTHER PUBLICATIONS

"A 160MHz Fourth Order Double Sampled SC Bandpass Sigma–Delta Modulator", Bazarjani et al., IEEE Transactions on Circuits and Systems, vol. 45, No. 5 May 1998 pp. 547–555.

"A10–b 20–Msample/s Analog–to–Digital Converter", Lewis et al., IEEE Journal Of Solid State Circuits, vol. 27 No. 3, Mar. 1992, pp. 357–0358.

*Primary Examiner*—My-Trang Nu Ton
*Attorney, Agent, or Firm*—Philip R. Wadsworth; Charles D. Brown

[57] ABSTRACT

A linear switch is incorporated into an active sample and hold switch. The active sample and hold circuit is symmetric and configured to accept a balanced input. Two linear switches couple a positive input signal of the balanced input to two different sampling capacitors. After the sampling capacitors are charged, another set of switches configures the sampling capacitors such that one of the sampling capacitor is in the feed back of an op amp and the other is connected from the input of the op amp to ground. In this configuration, the circuit has a gain of two and the output of the op amp is twice the voltage sampled by the sampling capacitors.

4 Claims, 8 Drawing Sheets

LINEAR SAMPLING SWITCH

BACKGROUND OF THE INVENTION

I. Field of the Invention

The invention relates to analog/radio frequency circuit design. More particularly, the invention relates to an analog/RF switch.

II. Description of the Related Art

A simple switched capacitor sample and hold circuit can be used to convert between an analog continuous time domain and a sampled data domain. FIG. 1 is a conceptual schematic diagram showing a simple switched capacitor sample and hold circuit. Typically the input signal ($v_{in}$) is a radio frequency (RF) or intermediate frequency (IF) signal which carries a band-limited, modulated signal. The input signal is applied to a switch 20 which opens and closes at a periodic clock frequency. A capacitor 22 is connected between the output of switch 20 and a common ground. The output voltage is generated across the capacitor 22. The capacitor 22 is typically a linear poly-poly or metal-metal capacitor. The output signal ($v_0$) is a sampled data signal. The sampling frequency at which the switch 20 is opened and closed must be higher than twice the modulated bandwidth of the input signal in order to satisfy the Nyquist Theorem. Thus, for a narrow-band signal, the sampling rate can be lower than the carrier frequency as long as it is twice the modulated bandwidth. Using a sampling frequency lower than the carrier frequency of the input signal is referred to as subsampling and is used to downconvert the input signal to a lower frequency.

The spectrum of the output signal contains copies of the input signal centered around multiples of the sampling frequency. For example, the spectral content of the out signal ($f_{out}$) can be expressed as shown in Equation 1.

$$f_{out} = nf_{clk} \pm f_{in} \tag{1}$$

where:

$f_{clk}$ is equal to the sampling frequency;

$f_{in}$ is equal to the frequency of the input signal; and n is equal to 0,1,2,3 . . . . . .

The output signal can be filtered to reduce the power level at the undesired frequencies. For instance, if the input signal is centered on a carrier at 240 megahertz (MHz) and the sampling circuit is clocked at 60 MHz, a replica of the modulated input signal appears at baseband, 60 MHz, 120 MHz, 180 MHz, as well as at several higher frequencies. The replicas above the baseband frequency can be filtered such that only the baseband replica is preserved.

The on resistance of the switch 20 is not ideal and, therefore, the switch 24 exhibits ohmic resistance even when the switch 20 is closed. FIG. 2 is a schematic diagram showing an equivalent circuit when the switch 20 is closed. A resistor 26 represents the on resistance of the switch 20. Due to the resistive nature of the closed switch, the output signal is related to the input signal in accordance with Equation 2, below.

$$v_o = \frac{v_{in}}{1 + sRC} \tag{2}$$

where:

$v_{in}$ is the voltage level of the input signal;

$v_{out}$ is the voltage level of the output signal;

C is the capacitance value of capacitor; and

R is the on-resistance of the closed switch.

It is evident from examining Equation 2 that the switched capacitor sampling circuit acts as a low pass filter.

In reality, the resistive value of the switch 20 is not constant and instead is a function of the voltage level of the input signal. FIG. 3 is an x/y graph showing the resistive value of an exemplary single nMOSFET switch as a function of the voltage level of the input signal. In FIG. 3, the horizontal axis represents the input signal voltage level in volts. The vertical axis represents the ohmic resistance of the switch on a logarithmic scale in Ohms (Σ). As shown in FIG. 3, the on resistance of a FET is a strong function of the voltage level of the input signal which is applied to it.

Taking into consideration the curve shown in FIG. 3, Equation 3 more accurately reflects the effect of the on resistance of the switch 20.

$$v_o = \frac{v_{in}}{1 + sR(v_{in})C} \tag{3}$$

where:

$R(v_{in})$ is equal to the voltage level dependent on resistance of the closed switch.

By examining Equation 3, one can see that not only does the switch act as a low pass filter but, in addition, the response of the low pass filter is a function of the voltage level of the input signal. For this reason, the switch is nonlinear and tends to create extremely high levels of distortion to the output signal.

FIG. 4 is a schematic diagram showing a parallel nMOSFET and pMOSFET (metal oxide semi-conductor field effect transistor) switch 24. The parallel switch 24 conducts signals so long as the voltage range of the input signal remains within the power supply voltages used to bias it. The parallel switch 24 exhibits substantially less variance in on resistance as a function of input signal level and, therefore, provides a more linear response.

FIG. 5 is an x/y graph showing the resistive value of a prior art parallel switch as a function of the voltage level of the input signal. In FIG. 5, the horizontal axis represents the input signal voltage level in volts. The vertical axis represents the ohmic resistance of the parallel switch in Ohms (Σ). Notice that between 1.0 to 1.4 Volts (V) the resistance of the switch varies by about 2.5 (i.e. $R(v_{in}=1)*2.5=R(v_{in}=1.4)$). Such high levels of variance of on resistance as a function input voltage can cause significant distortion in the sampling process.

The frequency response of the on-resistance of prior art parallel switches is also dependent on the input voltage level. FIG. 6 is an x/y graph showing the frequency response of a prior art parallel switch. The solid curve 28 represents the frequency response of the parallel switch at an input voltage level of 1.4V. The dotted curve 30 represents the frequency response of the parallel switch at an input voltage level of 1.0V. FIG. 7 is an x/y graph showing the phase response of a prior art parallel switch. The solid curve 32 represents the phase response of the parallel switch at an input voltage level of 1.4V. The dotted curve 34 represents the phase response of the parallel switch at an input voltage level of 1.0V. The divergence of the high frequency characteristics as a function of the input signal contributes additional nonlinearities to the performance of the switch and tends to more greatly distort the output signal.

When a switch with such non-linear properties is used to subsample a high frequency RF signal, the resultant samples are distorted. Therefore, the resultant samples do not accurately reflect the actual characteristics of the RF signal. As the distorted samples are subject to further processing within the receiver, the distortion produces errors. The errors can be so significant that using the switches at high frequencies is not practical and more expensive, larger and power-hungry down-conversion methods must be employed.

For these reasons, there is a need in the industry to develop a switch which exhibits a more linear response.

SUMMARY OF THE INVENTION

A linear switch is constructed with a p-channel and an n-channel field effect transistor (FET). A source node of the p-channel FET is coupled to a drain node of the n-channel FET to form a terminal of the switch. A drain node of the p-channel FET is coupled to a source node of the n-channel FET to form another terminal of the switch. The n-channel FET has a n-channel width. The p-channel FET has a p-channel width. The p-channel width is larger than the n-channel width in order to increase the linearity of the on-resistance of the resulting switch as a function of input voltage applied to one terminal and output voltage produced at the other terminal.

In one embodiment, a sampling capacitor is coupled to an output terminal of the switch. An input terminal of the switch is connected to a band-limited, modulated signal. Complementary clock signals are coupled to the gate node of the p-channel FET and the gate node of the n-channel FET. The complementary clock signals operate at a lower frequency than a center frequency of the band-limited, modulated signal. The output terminal produces a sub-sampled version of the band-limited, modulated signal.

In another embodiment, a linear switch is incorporated into an active sample and hold switch. The active sample and hold circuit is symmetric and configured to accept a balanced input. Two linear switches couple a positive input signal of the balanced input to two different sampling capacitors. After the sampling capacitors are charged, another set of switches configures the sampling capacitors such that one of the sampling capacitor is in the feed back of an op amp and the other is connected from the input of the op amp to ground. In this configuration, the op amp has a gain of two and the output of the op amp is twice the voltage sampled by the sampling capacitors.

In yet another embodiment, a linear switch is incorporated into a double sampled switch. The double sampled switch is symmetric and configured to accept a balanced input. Two linear switches alternately in time couple a first and second sampling capacitor to the positive input signal of the balanced input. While the first sampling capacitor is coupled to the input, the second sampling capacitor is configured to be connected in the feedback of an op amp. Likewise, while the second sampling capacitor is coupled to the input, the first sampling capacitor is configured to be connected in the feedback of the op amp, thus producing samples at double frequency.

BRIEF DESCRIPTION OF THE DRAWINGS

The features, objectives, and advantages of the invention will become more apparent from the detailed description set forth below when taken in conjunction with the drawings.

DETAILED DESCRIPTION OF THE INVENTION

Figure 2:
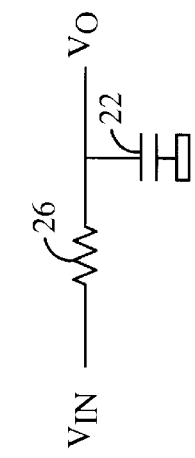
FIG. 2 is a schematic diagram showing an equivalent circuit to that of the switch in FIG. 1 when the switch of that circuit is closed.
Figure 4:
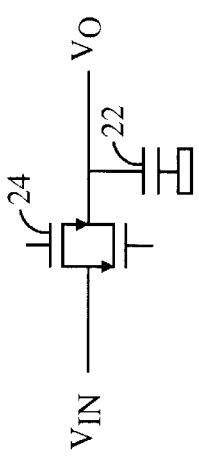
FIG. 4 is a schematic diagram showing a parallel nMOSFET and pMOSFET switch.
Figure 8:
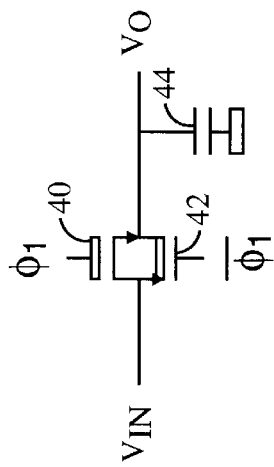
FIG. 8 is a schematic diagram showing a switched capacitor sample and hold circuit comprising the linear resistance parallel switch configured according to the invention.
Figure 1:
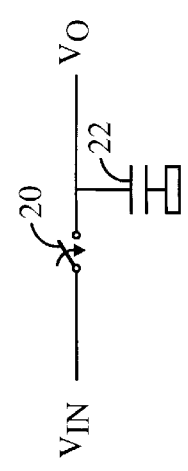
FIG. 1 is a conceptual schematic diagram showing a simple switched capacitor sample and hold circuit.
Figure 3:
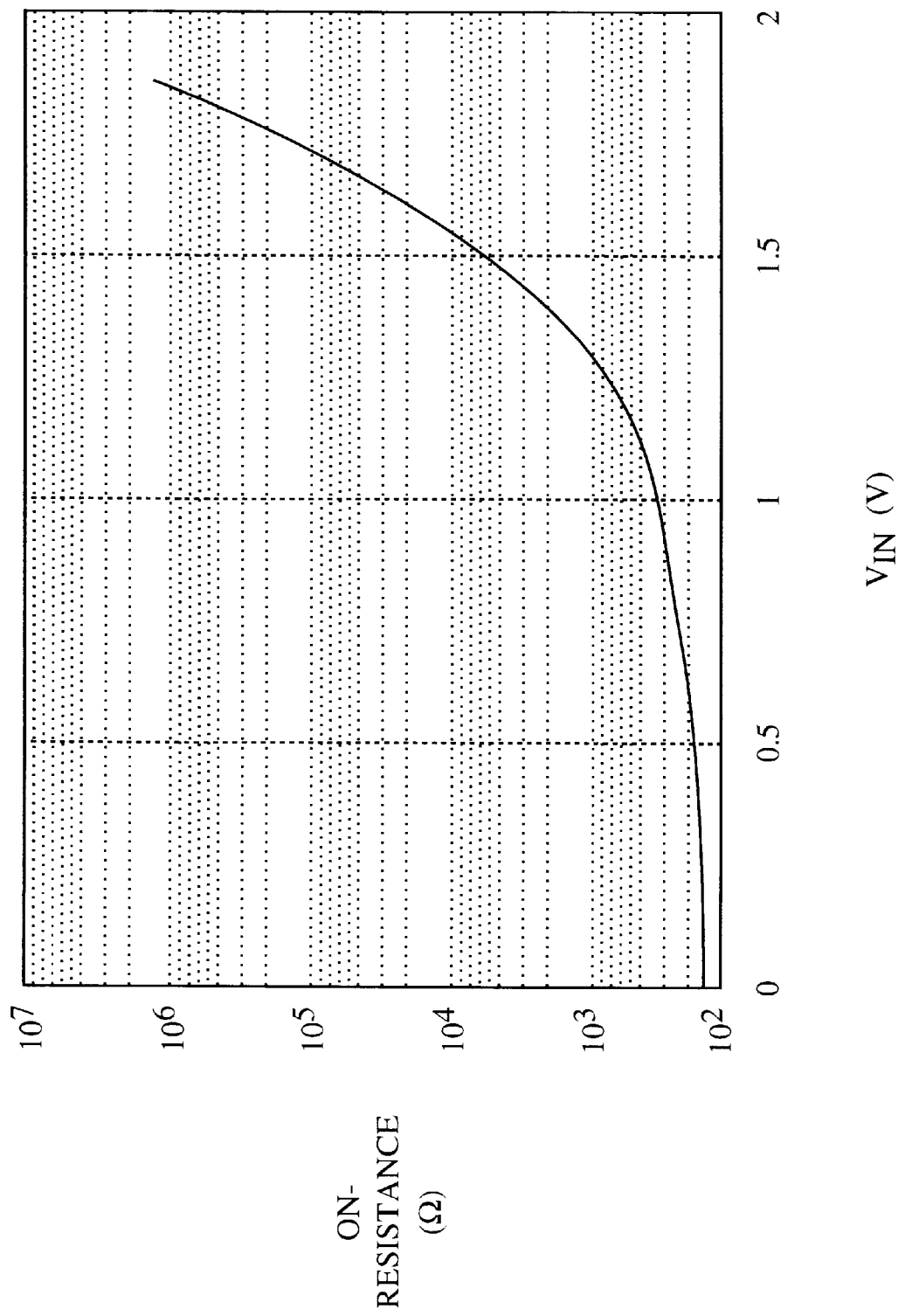
FIG. 3 is an x/y graph showing the resistive value of a prior art single nMOSFET switch as a function of the voltage level of the input signal.

Referring initially to FIG. 8, a schematic diagram is illustrated showing a switched capacitor sample and hold circuit comprising the linear resistance, parallel switch according to the invention. An n-channel FET 40 and a p-channel FET 42 are connected in parallel to create the switch. A source node of the p-channel FET 42 is coupled to a drain node of the n-channel FET 40 to form a terminal of the switch. A drain node of the p-channel FET 42 is coupled to a source node of the n-channel FET 40 to form another terminal of the switch. In general, the switch is bi-directional and either terminal can be used as either input or output. A capacitor 44 is used to sample the input voltage level when the switch is closed and to hold the output signal when the switch is open. The n-channel FET 40 and the p-channel FET 42 are coupled to complementary clock signals which open and close the switch. The conductance of the switch can be expressed in terms of the on conductance of the n-channel FET 40 and the p-channel FET 42 according to Equation 4.

$$g_{on} = g_n + g_p \qquad (4)$$

where:

$g_{on}$ is equal to the on conductance of the switch;

$g_n$ is equal to the on conductance of the n-channel FET 40; and $g_p$ is equal to the on conductance of the p-channel FET 42.

Substituting the well known equation for on conductance of a MOSFET, Equation 5 can be derived from Equation 4.

$$g_{on} = \mu_n C_{ox} \left(\frac{W}{L}\right)_n (V_{DD} - v_{in} - V_{tn}) + \mu_p C_{ox} \left(\frac{W}{L}\right)_p (v_{in} - V_{tp}) \quad (5)$$

where:

$$\left(\frac{W}{L}\right)_n$$

$$\left(\frac{W}{L}\right)_p$$

$V_{DD}$ is the drain voltage applied to the n-channel FET 40;
$v_{in}$ is voltage level of the input signal;
$V_{tn}$ is the threshold voltage of the n-channel FET 40;
$V_{tp}$ is the threshold voltage of the p-channel FET 42;
$c_{ox}$ is a technology dependent oxide capacitance;
$\mu_n$ is the mobility of the n-channel FET; and
$\mu_p$ is the mobility of the p-channel FET.

As can be seen by Equation 5, the on-conductance of the parallel switch is a function of the input voltage. The on-conductance of the parallel switch is both a linear function of the input voltage level and a non-linear function of the input voltage level.

The on-conductance of the parallel switch varies nonlinearly due to the dependence of the threshold voltages on the input voltage level as given by Equation 6.

$$V_t = V_{t0} + \gamma(\sqrt{2|\phi_F| + v_{SB}} - \sqrt{2\phi_F}) \quad (6)$$

where:
$V_{t0}$ is the zero back bias threshold;
$\gamma$ is the body factor;
—$\phi_F$— is absolute value of the surface inversion potential; and
$v_{SB}$ is the source to bulk potential (i.e. ($V_{ss}$-$v_{vt}$) for n-channel FET or ($V_{DD}$-$v_{in}$) for p-channel FET) sometimes called the back gate voltage.

If we assume for a moment that the on-conductance is only a linear function of the input voltage level, we can take a derivative with respect to input voltage level of Equation 5. By setting the derivative equal to 0, we get the result shown in Equation 7.

$$\mu_n \left(\frac{W}{L}\right)_n = \mu_p \left(\frac{W}{L}\right)_p \quad (7)$$

Substituting the result shown in Equation 7 into Equation 5 yields the results shown below in Equation 8 for the region in which both FETs are on as shown by the limitation in Equation 9.

$$g_{on}|_{constant} = 2\mu_n \left(\frac{W}{L}\right)_n [V_{DD} - (V_{in} + V_{tp})] \quad (8)$$

for:

$$V_{tp} < v_{in} < V_{DD} - V_{tn} \quad (9)$$

Notice that the linear dependence on the input voltage level is removed when the product of the p-channel mobility and the width to length ratio of the p-channel FET is equal to the product of the n-channel mobility and the width to length ratio of the n-channel FET. Thus, this condition is a good base point from which to design a parallel switch.

Figure 5:
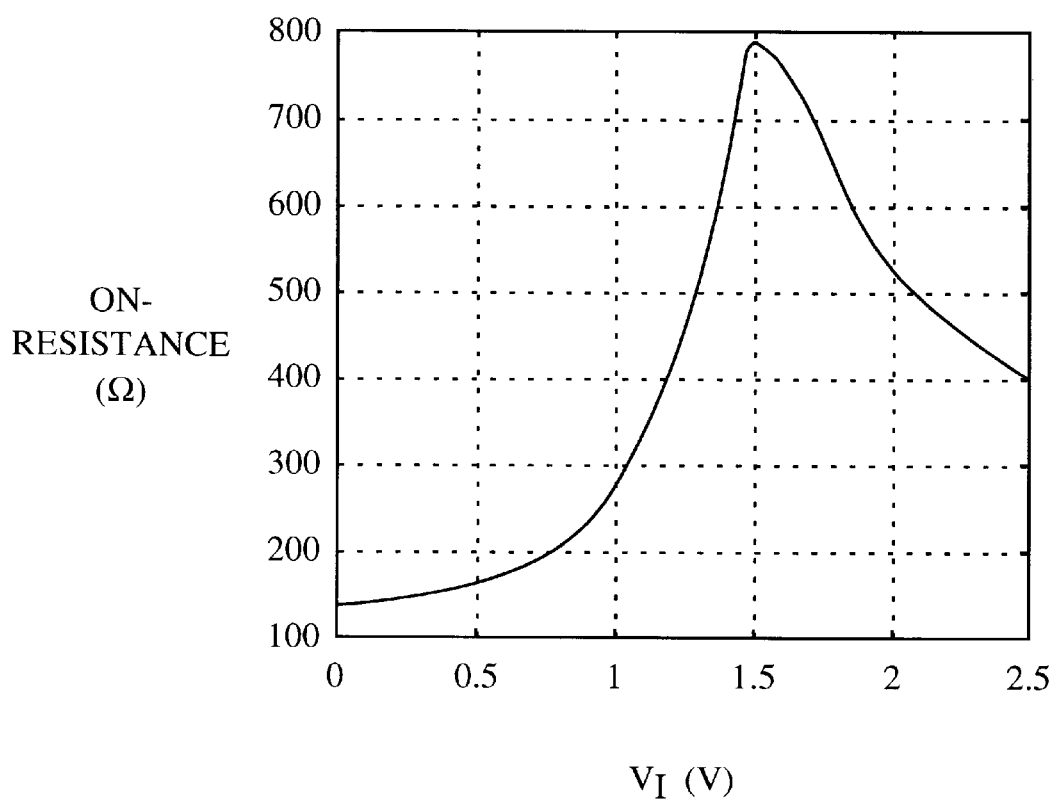
FIG. 5 is an x/y graph showing the resistive value of a prior art parallel switch as a function of the voltage level of the input signal.
Figure 6:
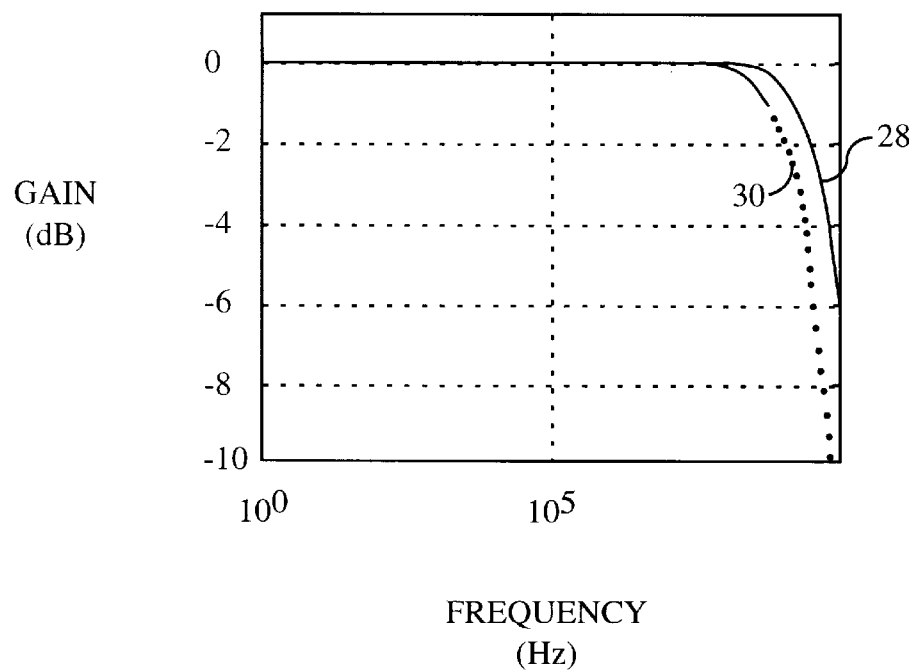
FIG. 6 is an x/y graph showing the frequency response of a prior art parallel switch.
Figure 7:
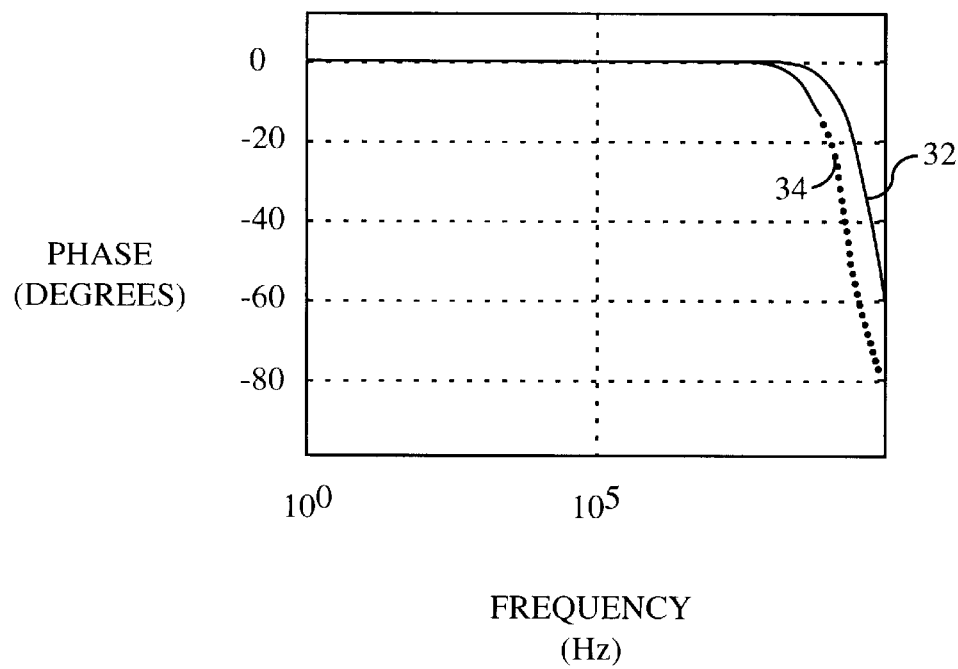
FIG. 7 is an x/y graph showing the phase response of a prior art parallel switch.

Typically, the n-channel electron mobility is equal to 1300 centimeters squared per volt second (cm²/vs) for silicon. Typically, the p-channel hole mobility is equal to 500 cm²/vs for silicon. However, the mobility of a function of the doping of a substrate and, thus, varies depending on the substrate technology on which the FET is formed. In prior art parallel switches, the width to length ratio for the n-channel and p-channel FETs are set equal to one another resulting in an on-resistance curve such as the one shown in FIG. 5. However, as seen by examination of Equation 7 and based upon the marked difference between electron and hole mobility, setting the width to length ratio equal is not the optimal starting point. In fact, for silicon, assuming that the length of the MOSFETs is maintained at the minimum available on the technology for best performance, it is advantageous to design the width of the p-channel FET to be 2, 2.3 2.5, 2.8, 3 times or more wider than the width of the n-channel FET. For germanium, it is also advantageous to design the width of the p-channel FET to be 2, 2.3 2.5, 2.8, 3 times or more wider than the width of the n-channel FET.

As noted above, the conductance of the parallel switch is also dependent on the input voltage level in a non-linear fashion. Therefore, in order to optimize the estimate, a design can be optimized in a commercial available DC simulator such as SPICE which was developed of the University of California, Berkeley.

In one exemplary embodiment, the switch is constructed from two FETs formed on a common substrate using 0.25 micron silicon technology. The width of the n-channel FET is set at 12 microns and the width of the p-channel FET was optimized to be 44 microns.

Figure 9:
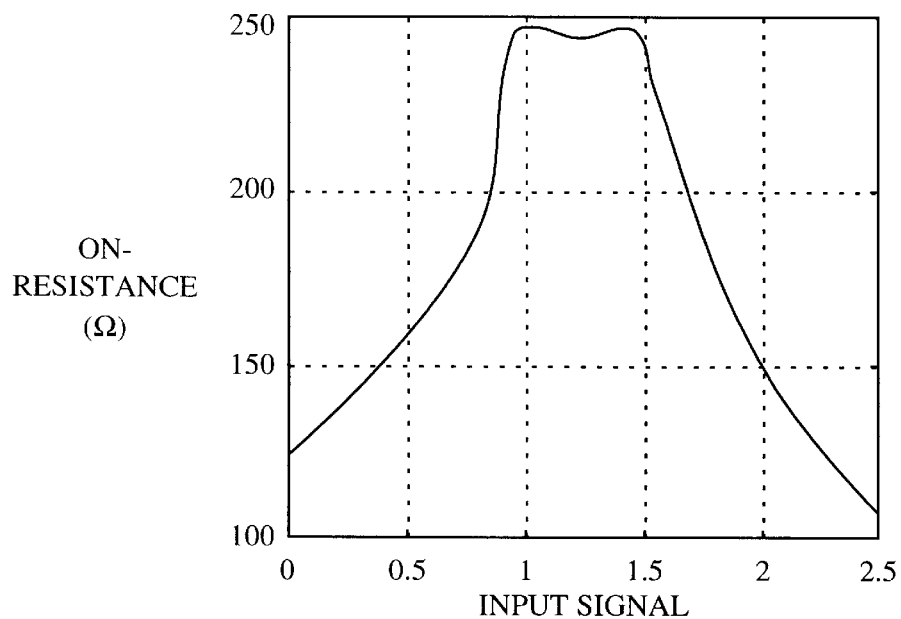
FIG. 9 is an x/y graph showing the resistive value of an exemplary parallel switch, configured according to the invention, as a function of the voltage level of the input signal.
Figure 10:
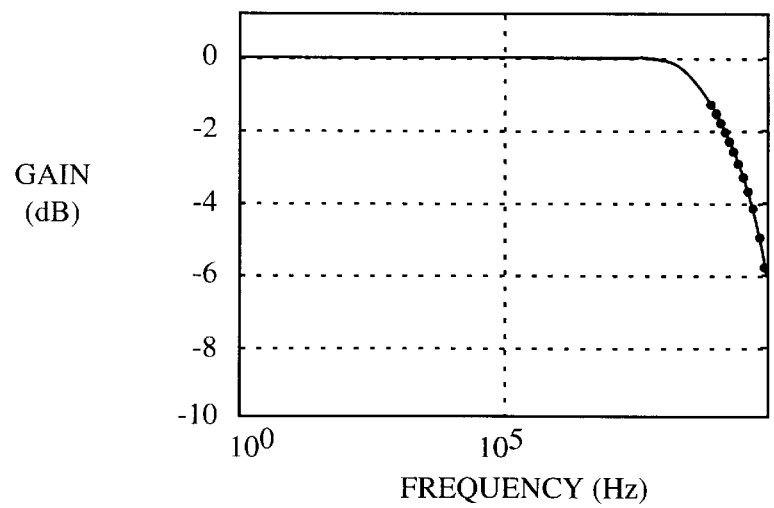
FIG. 10 is an x/y graph showing the frequency response of an exemplary parallel switch configured according to the invention.
Figure 11:
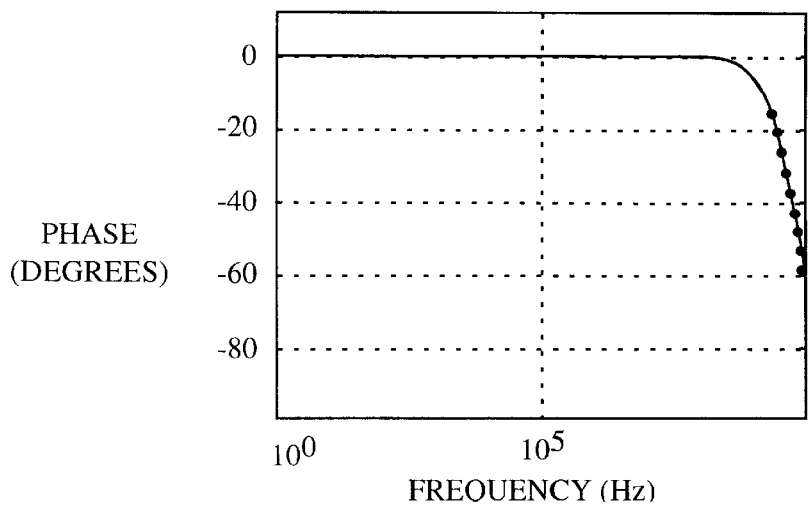
FIG. 11 is an x/y graph showing the phase response of an exemplary parallel switch configured according to the invention.

FIG. 9 is an x/y graph showing the resistive value of the exemplary parallel switch described above according to the invention as a function of the voltage level of the input signal using a 1 picofarad (pF) sampling capacitor. In FIG. 9, the horizontal axis represents the input signal voltage level in volts. The vertical axis represents the ohmic resistance of the parallel switch in Ohms ($\Sigma$). Notice that between 1.0 to 1.4 V the resistance of the switch varies by about 5%. The linearity of the switch can be reduced below 5% such as 4%, 2%, 1% or even less than 1% over the usable input voltage range depending on the tolerance with which the substance used to construct the device may be controlled but may be slightly more in other implementations such as 6, 7, 8, 9% or more. FIG. 10 is an x/y graph showing the frequency response of an exemplary parallel switch according to the invention. The solid curve represents the frequency response of the parallel switch at an input voltage level of 1.4V. The dotted curve represents the frequency response of the parallel switch at an input voltage level of 1.0V. Notice that they are nearly identical. FIG. 11 is an x/y graph showing the phase response of an exemplary parallel switch according to the invention. The solid curve represents the phase response of the parallel switch according to the invention at an input voltage level of 1.4V. The dotted curve 34 represents the phase response of the parallel switch according to the invention at an input voltage level of 1.0V. Notice that they are nearly identical. In both FIGS. 10 and 11, the 3 decibel (dB) point of the circuit was found to be 590 MHz at each voltage level plotted.

One advantage of sample and hold circuits is that they can used in the place of traditional front end assemblies. Traditional front end assemblies typically comprise a series of amplifiers, mixers and samplers. High frequency signals are received by the front end, amplified, down converted to a lower frequency and sampled. Through the use of subsampling, a sample and hold circuit may receive a high frequency signal and produce a sampled low frequency signal. If the sample and hold circuit is capable of high frequency operation, it may replace a substantial amount of the functions of a traditional front end assembly. A sample and hold circuit may provide improved performance, higher levels of integration, lower power consumption and reduced costs compared to conventional front end assemblies. However, if the sample and hold circuit produces a non-linear effect, the performance of the system may be degraded in comparison to traditional front end assemblies. Therefore, a subsampling, sample and hold circuit which is designed to operate at relatively high input frequencies is an ideal circuit in which to incorporate the invention.

Figure 12:
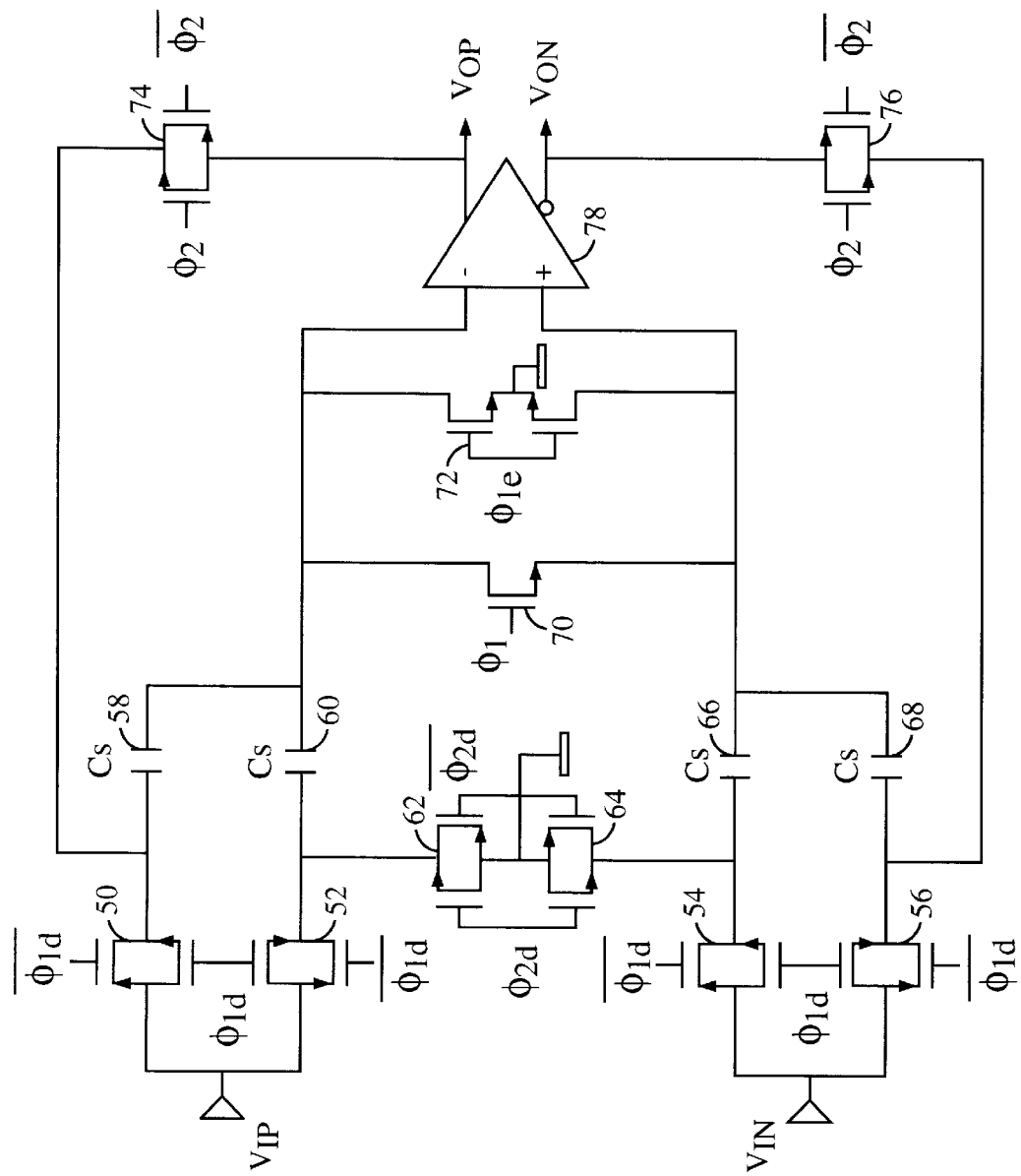
FIG. 12 is a schematic diagram showing an exemplary embodiment of a sample and hold circuit comprising a parallel switch configured according to the invention.

FIG. 12 is a schematic diagram showing an exemplary embodiment of a sample and hold circuit comprising a parallel switch according to the invention. $V_{ip}$ and $V_{in}$ represent a balanced input to the sample and hold circuit. In the preferred embodiment, the switches 50, 52, 54 and 56 are linear switches constructed as detailed above although other switch structures can be used. The inverted and non-inverted output of the circuit produce a subsampled version of a band-limited, modulated signal applied to the input. The linearity of switches 62, 64, 70, 74 and 76 and the switch pair 72 is less critical than the linearity of the switches which pass the high frequency signals and these switches can be either linear switches as detailed above or other switches. The capacitors 58, 60, 66 and 68 can be metal-metal or poly-poly type capacitors or any other type of capacitor exhibiting a linear relationship between charge (Q) and voltage (v). An operational amplifier 78 buffers the signal and also provides gain to the circuit. The illustrated circuit has a gain of two.

Figure 13:
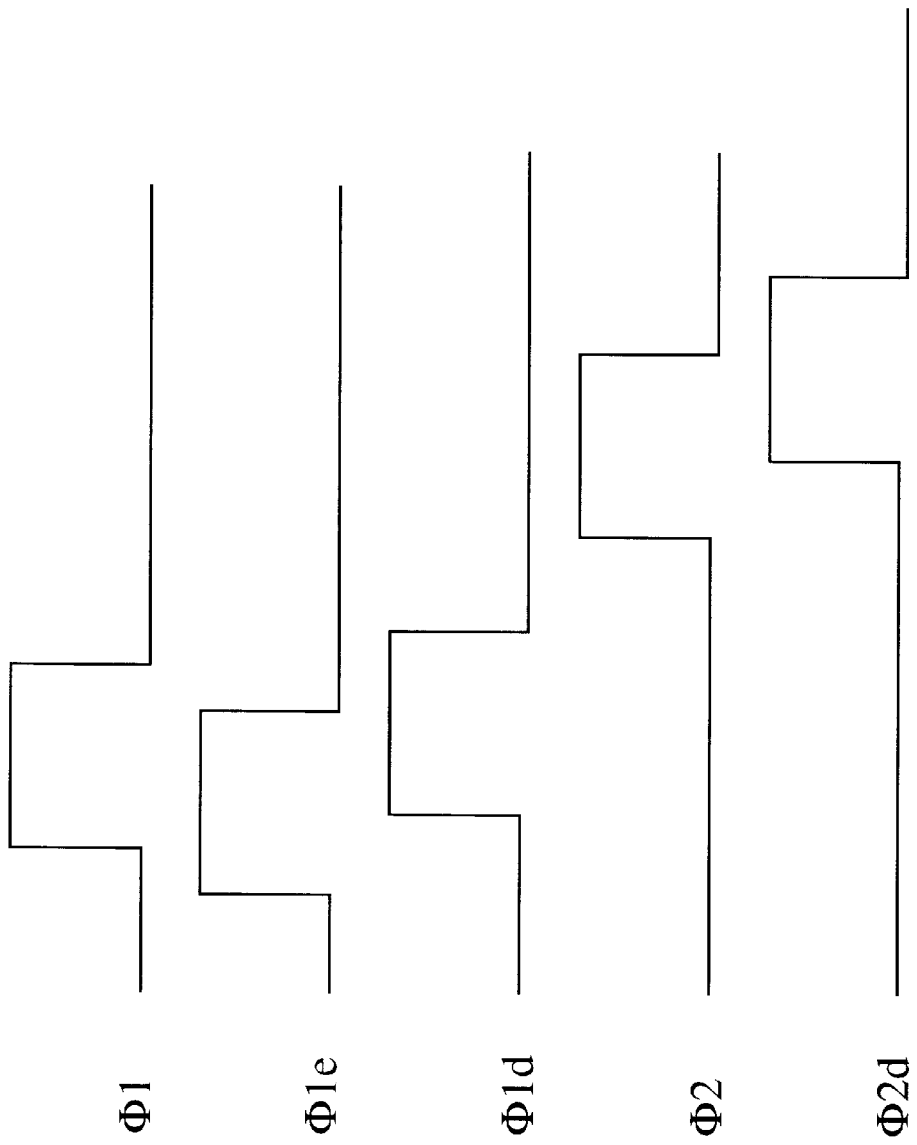
FIG. 13 is a timing diagram showing the time relationship of the clocks used to operate the circuit of FIG. 12.

Each of the switches is switched on and off according to a clock signal. If the circuit shown in FIG. 12 is used to subsample a high frequency signal, the clock frequency should be more than twice as high as the band-limited, modulation carried on the input signal. The frequency of the clock can be lower than the carrier frequency which carries the band-limited, modulated signal at the input to the circuit. FIG. 13 is a timing diagram showing the time relationship of the clocks used to operate the circuit in FIG. 12. The clock $\phi_1$ is the phase 1 clock. The clock $\phi_{1e}$ is an early phase of the phase 1 clock. The clock $\phi_{1d}$ is a delayed phase of the phase 1 clock. The clock $\phi_2$ is a non-overlapping phase 2 clock. The phase 1 and phase 2 clocks are non-overlapping in that the phase 1 clock's rising and falling edges each occur without an intervening transition in the phase 2 clock and vice versa. The clock $\phi_{2d}$ is a delayed phase of the non-overlapping phase 2 clock which is also non-overlapping with any of the phase 1 clocks. The clocks $\overline{\phi}_{1d}$, $\overline{\phi}_{2d}$ and $\overline{\phi}_{1d}$ are the inverse of the clocks $\phi_{1d}$, $\phi_{2d}$ and $\phi_2$, respectively.

Referring again to FIG. 12, it can be seen that the switch 50 and the switch 52 are both coupled to the positive input $V_{ip}$ and the capacitor 58 and the capacitor 60 are connected to the far side of the switches 50 and 52, respectively, in order to hold the sampled values. Likewise, the switch 54 and the switch 56 are both coupled to the negative input $V_{in}$, and the capacitor 66 and the capacitor 68, respectively, are connected to the far side of the switches 54 and 56 in order to hold the sampled value. The switch 62 is coupled between the junction of the switch 52 and the capacitor 60, and ground. The switch 64 is coupled between the junction of the switch 54 and the capacitor 66, and ground.

The far side of the capacitors 58 and 60 are coupled to the negative input of the op amp 78. The far side of the capacitors 66 and 68 are coupled to the positive input of the op amp 78. In addition, the switch 70 and switch pair 72 are connected in parallel between the negative and positive inputs of the op amp 78. In one embodiment, the switch 70 is an nMOSFET switch which exhibits good mobility and conductance. In one embodiment, the switch pair 72 is a set of nMOSFET switches which exhibit good mobility and conductance. The switch pair 72 also has a ground connection. The switch 74 is coupled between the junction of the switch 50 and the capacitor 58, and the non-inverted output $V_{op}$ of the op amp 78. The switch 76 is coupled between the junction of the switch 56 and the capacitor 68, to the inverted output $V_{on}$,fn of the op amp 78.

The phase 1 clock is used to sample the input. The phase 2 clock is used to transfer the charge from the capacitors 60 and 66 to the capacitors 58 and 68, respectively, to produce the sampled output with a gain of two. When the switches 70, 50, 52, 54 and 56 and the switch pair 72 are closed and the remainder of the switches are open, the capacitors 58, 60, 66 and 68 sample the input voltage level. Subsequently, when the switches 70, 50, 52, 54 and 56 and the switch pair 72 open and the switches 62, 64, 74 and 76 close, the capacitors 58 and 68 form the feed back loop to op amp 78. The capacitors 60 and 66 are grounded to set the gain of the circuit to two.

The switch 70 is clocked with the phase 1 clock $\phi_1$ and the switch pair 72 is clocked with the early phase of the phase 1 clock $\phi_{1e}$. This clock sequencing ensures that the potential on far side of the capacitors 60 and 66 is set to ground shortly before the switch 70 opens to determine the sampling instance. The switches 50, 52, 54 and 56 are clocked with the delayed phase of the phase 1 clock $\phi_{1d}$ and clock $\overline{\phi}_{1d}$, and are opened shortly after the sampling instance to disconnect the sampling capacitors 58, 60, 64 and 68 from the input such that the sampled charge are stored thereon. This clock sequencing reduce any signal dependent charge injections into the sampling capacitors 58, 60, 66 and 68.

The switches 74 and 76 are closed with the phase 2 clock $\phi_2$ and clock $\overline{\phi}_2$ in order to close the feed back loop around the op amp 78. Shortly thereafter, the switches 64 and 62 are clocked with the delayed phase of the phase 2 clock $\phi_{2d}$ and clock $\overline{\phi}_{2d}$ in order to connect the input of the sampling capacitors 58, 60, 66 and 68 to ground. By grounding the input of the sampling capacitors 60 and 66, the charges on the sampling capacitors 60 and 66 are transferred to the sampling capacitors 58 and 68 which are now in the op amp 78 feed back path. Because the input to the op amp 78 is at a ground potential, the output of the op amp 78 is now twice the sampled voltage level, thus, completing one sample cycle.

If the switches 50, 52, 54 and 56 are constructed according to the invention to provide linear switching characteristics, the sample and hold circuit exhibits a high degree of linearity due to the relative independence of the frequency and resistive response of the circuitry to the voltage level of the input signal. In addition, the circuit offers an advantage over the simple parallel switch shown in FIG. 8 in that it provides a gain of two, and isolation between the input and the output as well as substantial current driving capabilities.

Figure 14:
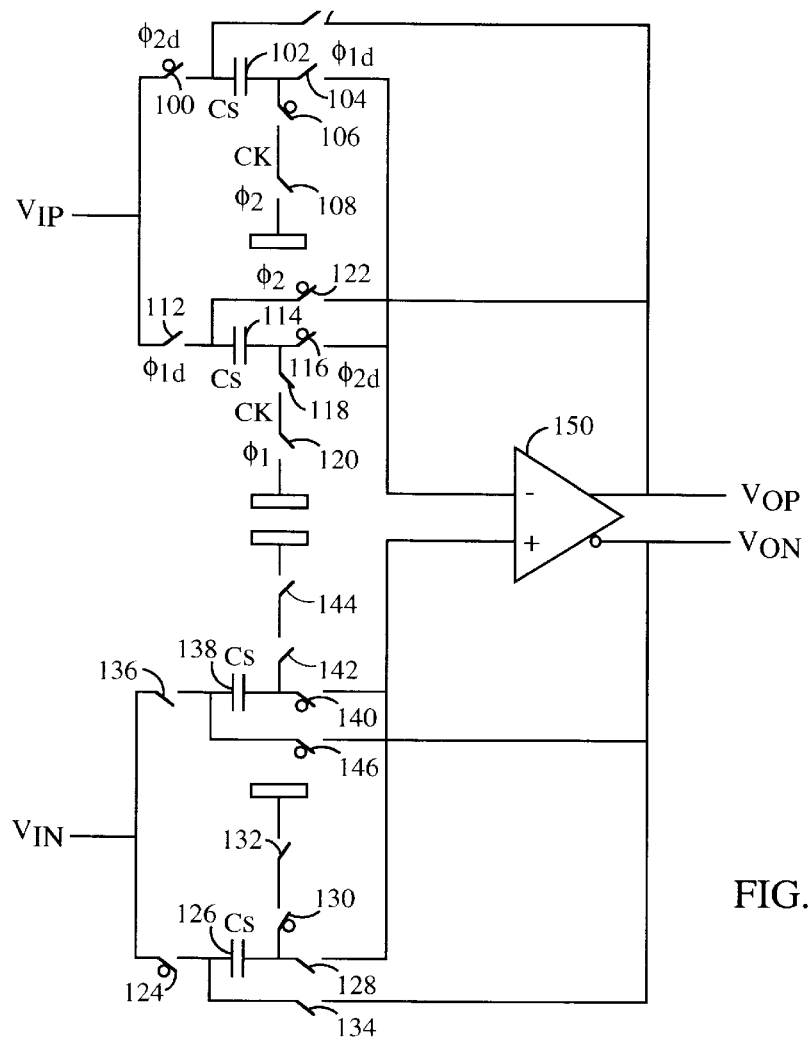
FIG. 14 is a schematic diagram showing an exemplary embodiment of a double sampled, unity gain, switched capacitor circuit comprising a parallel switch configured according to the invention.

FIG. 14 is a schematic diagram showing an exemplary embodiment of a double sampled, unity gain, switched capacitor circuit comprising a parallel switch configured according to the invention. In FIG. 14, the parallel switches according to the invention are shown as single switches in order to avoid over cluttering the drawing. In additional to the information given below, information concerning double sampled circuits can be found in "A 160 MHz Fourth-Order Double-Sampled SC Bandpass Sigma-Delta Modular" IEEE Transactions on Circuits and Systems—II: Analog and Digital Signal Processing, May 1998, Vol. 45, No. 5, pp. 547–555 by Seyfi Bazarjani and W. Martin Snelgrove which is incorporated herein by this reference.

Figure 15:
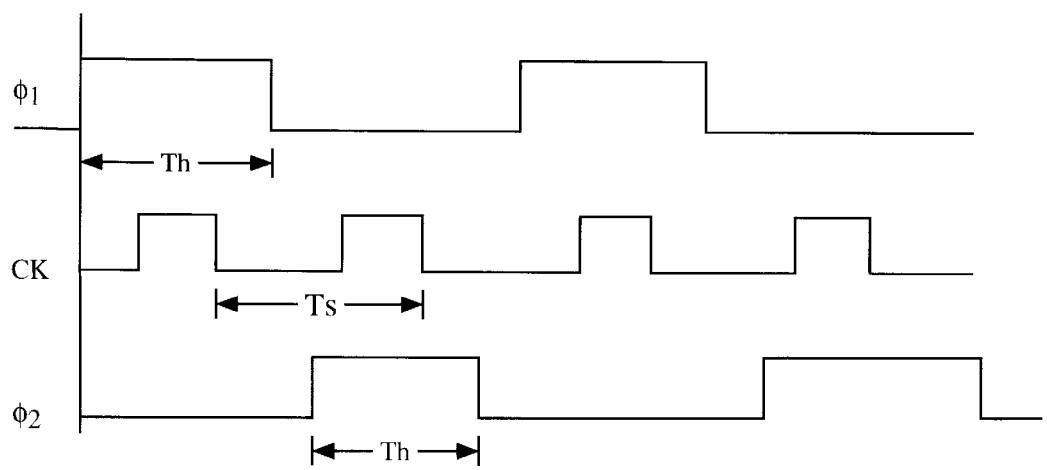
FIG. 15 is a timing diagram showing the time relationship of the clocks used to operate the circuit of FIG. 14.

The double sampled, unity gain, switched capacitor circuit accepts a balanced input. The design is differentially symmetric and the positive and negative input portions of the circuit operate in the same manner. Each of the switches is switched on and off according to a clock signal. If the circuit shown in FIG. 14 is used to subsample a high frequency signal, the clock frequency should be more than twice as high as the band-limited, modulation carried on the input signal. The frequency of the clock can be lower than the carrier frequency which carries the band-limited, modulated signal at the input to the circuit. FIG. 15 is a timing diagram showing the time relationship of the clocks used to operate the circuit in FIG. 14. The main system clock CK is used to derive the two other clocks shown in FIG. 15. The period of the clock CK, T, is fixed according to the desired sampling frequency, $f_s$. The clock $\phi_1$ is the phase 1 clock. The clock $\phi_{1d}$, not shown, is a delayed phase of the phase 1 clock. The clock $\phi_2$ is a non-overlapping phase 2 clock. The clock $\phi_{2d}$, not shown, is a delayed phase of the non-overlapping phase 2 clock.

The balanced input is applied at the positive input $V_{ip}$ and the negative input $V_{in}$. A switch 100 and a switch 112 are both coupled to the positive input $V_{ip}$ and a capacitor 102 and a capacitor 114 are connected to the far side of the switches 100 and 112, respectively, in order to alternately hold the sampled values. Likewise, a switch 124 and switch 136 are both coupled to the negative input $V_{in}$ and a capacitor 126 and a capacitor 138, respectively, are connected to the far side of the switches 124 and 136 in order to alternately hold the sampled value.

A switch 110 is coupled between the junction of the switch 100 and the capacitor 102, and the positive output $V_{op}$ of an op amp 150. A switch 122 is coupled between the junction of the switch 112 and the capacitor 114, and the positive output $V_{op}$ of the op amp 150. A switch 134 is coupled between the junction of the switch 124 and the capacitor 126, and the negative output $V_{on}$ of the op amp 150. A switch 146 is coupled between the junction of the switch 136 and the capacitor 138, and the negative output $V_{on}$ of the op amp 150.

The far side of the capacitors 102 and 114 are coupled to the negative input of the op amp 150 through a switch 104 and a switch 116, respectively. The far sides of the capacitors 126 and 138 are coupled to the positive input of the op amp 150 through a switch 128 and a switch 140, respectively. A switch 106 and a switch 108 are connected in series to ground from the junction of the capacitor 102 and the switch 104. A switch 116 and a switch 120 are connected in series to ground from the junction of the capacitor 114 and the switch 116. A switch 130 and a switch 132 are connected in series to ground from the junction of the capacitor 124 and the switch 128. A switch 142 and a switch 144 are connected in series to ground from the junction of the capacitor 138 and the switch 140.

In the preferred embodiment, the switches 100, 112, 124 and 136 are linear switches constructed as detailed above although other switch structures can be used. It is advantageous for the switches 100, 112, 124 and 136 to have linear properties in order to avoid distortion of the incoming high frequency signal during the sampling process as detailed above. The other switches can be linear switches as detailed above or they may have other circuit structures such as standard pMOSFET or riMOSFET switches which exhibit good mobility and conductance. The sampling capacitors 102, 114, 126 and 138 can be metal-metal or poly-poly type capacitors or any other type of capacitor exhibiting a linear relationship between charge (Q) and voltage (v).

The main clock CK is used to trigger collection of samples by means of the switches 106, 118, 130 and 142. The switch 108 in series with switch 106 prevents the grounding of the junction of the capacitor 102 and the switch 104 at the falling-edges of the clock CK which occur while the phase 1 clock is high and the phase 2 clock is low. Likewise, the switch 120 prevents the grounding of the junction of the capacitor 114 and the switch 116 at the falling-edges of the clock CK which occur while the phase 2 clock is high and the phase 1 clock is low. The switch 132 performs the same function as the switch 108 and the switch 144 performs the same function as the switch 120.

Using the clock CK ensures that the sampling instances are uniformly spaced in time with relation to one another independent of which capacitor is being used to sample the input. The time between falling-edges of the clock CK is uniform if the frequency of the clock CK is fixed. For example, the clock CK operates at a frequency $f_s$ and, therefore, has a period of $T_s$ as labeled on FIG. 15. The paper referred to above does not disclose the use of a uniform clock CK or the corresponding switches 106, 116, 142 or 130 and, therefore, must rely on the falling-edge of the phase 1 and phase 2 clocks which are not guaranteed to be uniformly spaced in time with relation to one another adding further distortion to the sampling process.

The switches 100 and 112 are clocked by the delayed phase of the phase 2 clock $\phi_{2d}$ and the delayed phase of the phase 1 clock $\phi_{1d}$, respectively, alternately connecting the positive input to one of the two sampling capacitors 102 and 114. While the switch 112 connects the capacitor 114 to the input, the switches 104 and 110 close to connect the capacitor 102 into the feed back of the op amp 150 while the switches 106 and 108 are open. While the switch 100 connects the capacitor 102 to the input, the switches 116 and 122 close to connect the capacitor 114 into the feed back of the op amp 150. A corresponding operation is carried out within the negative input portion of the circuit. Thus, samples are produced at the output of the op amp at the frequency $f_s$ of the clock CK rather than the lower frequency of the phase 1 and phase 2 clocks. At the same time, the clock CK is not used in the closed loop configuration of the op amp. Therefore, the op amp 150 is only required to settle within the relatively long period of time over which the phase 1 and phase 2 clocks are high, $T_h$, rather than the shorter period of time over which the clock CK is high reducing the op amp performance characteristics demanded by the circuit.

The circuit shown in FIG. 14 consumes about one half of the power of the circuit shown in FIG. 12 when running at the same frequency. Alternatively, the circuit shown in FIG. 14 can operate at twice the frequency of the circuit shown in FIG. 12 while consuming approximately the same current. These efficiencies are gained because the op amp is nearly constantly producing an output in comparison with FIG. 12 where the op amp lies idle about one half of the time. This circuit can be used in a variety of applications such as sample and hold circuits or analog to digital converters.

A myriad of alternate embodiments within the scope of the invention will be readily discernible to one skilled in the art upon examination of the above disclosure. The techniques can be applied to complimentary metal oxide semiconductors (CMOS) and junction field effect technology (JFET) semiconductors. These same principles may be applied to gallium arsenide (GAs) as well. Also, the capacitors 60 and 66 of FIG. 12 may be removed if unity gain is desired.

The invention may be embodied in other specific forms without departing from its spirit or essential characteristics. The described embodiment is to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. A subsampling, sample and hold circuit comprising:

a balanced input configured to be coupled to a band-limited, modulated signal;

first and second linear switches each having a first side coupled to a positive input of said balanced input and configured to be clocked by a delayed phase of a phase 1 clock;

a first holding capacitor coupled to a far side of said first linear switch;

a second holding capacitor coupled to a far side of said second linear switch;

a third switch coupled between the junction of said second linear switch and said second holding capacitor and a common ground and configured to be clocked by a delayed phase of a non-overlapping phase 2 clock;

a fourth switch having a first side coupled to the junction of said first linear switch and said first holding capacitor configured to be clocked by said non-overlapping phase 2 clock;

fifth and sixth linear switches each having a first side coupled to a negative input of said balanced input, and configured to be clocked by said delayed phase of said phase 1 clock;

a third holding capacitor coupled to a far side of said fifth linear switch;

a fourth holding capacitor coupled to a far side of said sixth linear switch;

a seventh switch coupled between the junction of said sixth linear switch and said fourth holding capacitor and said common ground, said seventh switch configured to be clocked by said delayed phase of said non-overlapping phase 2 clock;

a eighth switch having a first side coupled to the junction of said fifth linear switch and said third holding capacitor configured to be clocked by said non-overlapping phase 2 clock;

an op amp having a negative input coupled to a far side of said first and second capacitors, a positive input coupled to a far side of said third and fourth capacitors and having a positive output coupled to a far side of said fourth switch, and an inverted output coupled to a far side of said eighth switch;

a ninth switch connected between said positive and negative input of said op amp and configured to be clocked by said phase 1 clock; and a tenth switch pair connected between said positive and negative input of said op amp and said common ground and configured to be clocked by an early phase of said phase 1 clock;

wherein said phase 1 clock and said non-overlapping phase 2 clock are configured to operate at a lower frequency than a center frequency of said band-limited, modulated signal and said inverted and non inverted output of said op amp produce a subsampled version of said band-limited, modulated signal.

2. The circuit of claim 1, wherein said first, second, fifth and sixth linear switches comprise:

a n-channel FET having a n-channel width; and a p-channel FET having a p-channel width;

wherein a source node of said p-channel FET is coupled to a drain node of said n-channel FET and a drain node of said p-channel FET is coupled to a source node of said n-channel FET; and wherein said p-channel width is larger than said n-channel width in order to increase the linearity of said switch.

3. A symmetric, double sampled circuit having a positive input portion comprising:

first and second linear switches each having a first side coupled to a positive input of a balanced input and configured to be clocked by a delayed phase of a phase 1 clock and a delayed phase of a phase 2 clock, respectively;

a first holding capacitor coupled to a far side of said first linear switch;

a second holding capacitor coupled to a far side of said second linear switch;

a third switch coupled between the junction of said first linear switch and said first holding capacitor and a positive output of an op amp and configured to be clocked by said phase 2 clock;

a fourth switch coupled between the junction of said second linear switch and said second holding capacitor and said positive output of an op amp and configured to be clocked by said phase 1 clock;

fifth and sixth switches in series to ground coupled to said far side of said first sampling capacitor, said fifth switch configured to be clocked by a main clock operating at twice the frequency of said phase 1 and phase 2 clocks and said sixth switch configured to be clocked by said phase 1 clock;

seventh and eighth switches in series to ground coupled to said far side of said second sampling capacitor, said seventh switch configured to be clocked by said main clock and said eighth switch configured to be clocked by said phase 2 clock;

a ninth switch coupled between said far side of said first sampling capacitor and a negative input to said op amp and configured to be clocked with said delayed phase of said phase 2 clock; and a tenth switch coupled between said far side of said second sampling capacitor and said negative input to said op amp and configured to be clocked with said delayed phase of said phase 1 clock;

wherein said phase 1 and phase 2 clocks are non-overlapping and derived from said main clock.

4. The circuit of claim 3, wherein said first and second linear switches comprise:

a n-channel FET having a n-channel width; and a p-channel FET having a p-channel width;

wherein a source node of said p-channel FET is coupled to a drain node of said n-channel FET and a drain node of said p-channel FET is coupled to a source node of said n-channel FET;

wherein said p-channel width is larger than said n-channel width in order to increase the linearity of said switch.

* * * * *